United States Patent
Cui et al.

(10) Patent No.: US 8,623,766 B2
(45) Date of Patent: Jan. 7, 2014

(54) COMPOSITION AND METHOD FOR POLISHING ALUMINUM SEMICONDUCTOR SUBSTRATES

(75) Inventors: Ji Cui, Aurora, IL (US); Steven Grumbine, Aurora, IL (US); Glenn Whitener, Batavia, IL (US); Chih-An Lin, New Taipei (TW)

(73) Assignee: Cabot Microelectronics Corporation, Aurora, IL (US)

( * ) Notice: Subject to any disclaimer, the term of this patent is extended or adjusted under 35 U.S.C. 154(b) by 93 days.

(21) Appl. No.: 13/237,881

(22) Filed: Sep. 20, 2011

(65) Prior Publication Data
US 2013/0072021 A1    Mar. 21, 2013

(51) Int. Cl.
*H01L 21/302* (2006.01)
*H01L 21/461* (2006.01)

(52) U.S. Cl.
USPC ............ 438/693; 438/692; 257/E21.23

(58) Field of Classification Search
USPC .................... 438/693, 692; 216/89
See application file for complete search history.

(56) References Cited

U.S. PATENT DOCUMENTS

| 2003/0124959 | A1* | 7/2003 | Schroeder et al. | 451/41 |
| 2010/0075500 | A1* | 3/2010 | Yoshikawa et al. | 438/692 |
| 2010/0308016 | A1* | 12/2010 | Chinnathambi et al. | 216/89 |

* cited by examiner

*Primary Examiner* — Nadine Norton
*Assistant Examiner* — Mahmoud Dahimene
(74) *Attorney, Agent, or Firm* — Thomas E Omholt; Francis J. Koszyk; Steven D Weseman

(57) ABSTRACT

The invention provides a chemical-mechanical polishing composition comprising coated α-alumina particles, an organic carboxylic acid, and water. The invention also provides a chemical-mechanical polishing composition comprising an abrasive having a negative zeta potential in the polishing composition, an organic carboxylic acid, at least one alkyldiphenyloxide disulfonate surfactant, and water, wherein the polishing composition does not further comprise a heterocyclic compound. The abrasive is colloidally stable in the polishing composition. The invention further provides methods of polishing a substrate with the aforesaid polishing compositions.

16 Claims, No Drawings

COMPOSITION AND METHOD FOR POLISHING ALUMINUM SEMICONDUCTOR SUBSTRATES

BACKGROUND OF THE INVENTION

Integrated circuits are made up of millions of active devices formed in or on a substrate, such as a silicon wafer. In one manufacturing process, a dielectric substrate is patterned by a conventional dry etch process to form holes and trenches for vertical and horizontal interconnects. The patterned surface is then optionally coated with a diffusion barrier layer and/or an adhesion-promoting layer, followed by deposition of a metal layer to fill the trenches and holes. Chemical-mechanical polishing (CMP) is employed to reduce the thickness of the metal layer, as well as the thickness of the diffusion barrier layer and/or adhesion-promoting layer, until the underlying dielectric layer is exposed, thereby forming the circuit device.

One way to fabricate planar metal circuit traces on a silicon dioxide substrate is referred to as the damascene process. In accordance with this process, the silicon dioxide dielectric surface having optionally a layer of silicon nitride deposited thereon is patterned by applying a photoresist, exposing the photoresist to irradiation through a pattern to define trenches and/or vias, and then using a conventional dry etch process to form holes and trenches for vertical and horizontal interconnects. The silicon nitride functions as a "hard mask" to protect the silicon dioxide surface that is not part of the trenches and/or vias from damage during etching. The patterned surface is coated with an adhesion-promoting layer such as titanium or tantalum and/or a diffusion barrier layer such as titanium nitride or tantalum nitride. The adhesion-promoting layer and/or the diffusion barrier layer are then over-coated with a metal layer. Chemical-mechanical polishing is employed to reduce the thickness of the metal over-layer, as well as the thickness of any adhesion-promoting layer and/or diffusion barrier layer, until a planar surface that exposes elevated portions of the silicon oxide surface is obtained. The vias and trenches remain filled with electrically conductive metal forming the circuit interconnects.

Tungsten and copper are most frequently used as the electrically conductive metal. However, aluminum, which had been used in earlier generation processes to fabricate circuit interconnects via subtractive processes such as etching techniques, has been under increasing consideration for use in damascene processes. The combination of aluminum and titanium offers potentially lower resistivity than other metal/barrier layer combinations, with corresponding potential improvement in circuit performance.

Polishing compositions for aluminum damascene structures comprising alumina abrasives treated with sulfonate-containing polymers or copolymers have been described. While the sulfonate-containing polymers or copolymers are intended to confer colloidal stability to the alumina abrasives, the presence of other polishing components such as complexing agents, topography control agents, and surface treatment polymers can result in displacement of the sulfonate-containing polymers or copolymers from the alumina abrasive particles, with the result that colloidal stability of the polishing compositions is compromised. Interparticle agglomeration leading to large particles can lead to scratching and other surface defects on substrates being polished. Thus, there remains a need in the art for improved methods of polishing aluminum-containing substrates.

BRIEF SUMMARY OF THE INVENTION

The invention provides a method of chemically-mechanically polishing a substrate, which method comprises (i) providing a substrate comprising at least one layer of aluminum, (ii) providing a polishing pad, (iii) providing a polishing composition comprising (a) α-alumina particles coated with a copolymer comprising at least one sulfonate monomer and at least one monomer selected from the group consisting of carboxylate monomers, phosphonate monomers, and phosphate monomers, (b) a complexing agent for aluminum, and (c) water, (iv) contacting a surface of the substrate with the polishing pad and the polishing composition, and (v) abrading at least a portion of the surface of the substrate to remove at least some aluminum from the surface of the substrate and to polish the surface of the substrate, wherein the polishing composition has a pH of about 1 to about 6, and wherein the abrasive is colloidally stable in the polishing composition.

The invention also provides a method of chemically-mechanically polishing a substrate, which method comprises (i) providing a substrate comprising at least one layer of aluminum, (ii) providing a polishing pad, (iii) providing a polishing composition comprising (a) an abrasive, wherein the abrasive comprises particles having a negative zeta potential in the polishing composition, (b) a complexing agent for aluminum, (c) at least one alkyldiphenyloxide disulfonate surfactant, and (c) water, (iv) contacting a surface of the substrate with the polishing pad and the polishing composition, and (v) abrading at least a portion of the surface of the substrate to remove at least some aluminum from the surface of the substrate and to polish the surface of the substrate, wherein the polishing composition has a pH of about 1 to about 6, and wherein the abrasive is colloidally stable in the polishing composition.

The invention further provides a chemical-mechanical polishing composition comprising (a) α-alumina particles coated with a copolymer consisting essentially of at least one sulfonate monomer and at least one acrylate monomer, (b) an organic carboxylic acid, and (c) water, wherein the polishing composition has a pH of about 1 to about 6, and wherein the abrasive is colloidally stable in the polishing composition.

The invention additionally provides a chemical-mechanical polishing composition comprising (a) an abrasive, wherein the abrasive comprises particles having a negative zeta potential in the polishing composition, (b) an organic carboxylic acid, (c) at least one alkyldiphenyloxide disulfonate surfactant, and (d) water, wherein the polishing composition has a pH of about 1 to about 6, wherein the abrasive is colloidally stable in the polishing composition, and wherein the polishing composition does not comprise a compound of the formula: $(X^2)_n$-L wherein $X^2$ represents tetrazole, 1,2,4-triazole, 1,2,3-triazole, or benzotriazole, and wherein L represents a linking group.

DETAILED DESCRIPTION OF THE INVENTION

The invention provides a method of chemically-mechanically polishing a substrate, which method comprises (i) providing a substrate comprising at least one layer of aluminum, (ii) providing a polishing pad, (iii) providing a polishing composition, (iv) contacting a surface of the substrate with the polishing pad and the polishing composition, and (v) abrading at least a portion of the surface of the substrate to remove at least some aluminum from the surface of the substrate and to polish the surface of the substrate. The polishing composition comprises (a) α-alumina particles coated with a copolymer comprising at least one sulfonate monomer and at least one monomer selected from the group consisting of carboxylate monomers, phosphonate monomers, and phosphate monomers, (b) a complexing agent for aluminum, and (c) water. Alternatively, the polishing composition comprises (a) an abrasive, wherein the abrasive comprises particles having a negative zeta potential in the polishing composition, (b) a complexing agent for aluminum, (c) at least one alkyldiphenyloxide disulfonate surfactant, and (c) water. In both situations, the polishing composition has a pH of about 1 to about 6, and the abrasive is colloidally stable in the polishing composition.

The abrasive can be any suitable abrasive, for example, the abrasive can be natural or synthetic, and can comprise metal oxide, carbide, nitride, carborundum, and the like. The abrasive also can be a polymer particle or a coated particle. The abrasive desirably comprises, consists essentially of, or consists of a metal oxide. In a preferred embodiment, the metal oxide is alumina. The alumina can comprise, consist essentially of, or consist of any suitable phase of alumina, for example, $\alpha$-alumina, $\gamma$-alumina, $\delta$-alumina, fumed alumina, and combinations thereof. Most preferably, the metal oxide comprises, consists essentially of, or consists of $\alpha$-alumina. When the abrasive comprises $\alpha$-alumina, the abrasive also can comprise other forms of alumina, such as fumed alumina. In some embodiments, the abrasive consists of $\alpha$-alumina.

The abrasive can have any suitable average particle size (i.e., average particle diameter). In particular, and especially when the abrasive is alumina, the abrasive can have an average particle size (e.g., average particle diameter) of about 15 nm or more (e.g., about 20 nm or more, about 30 nm or more, or about 40 nm or more, or about 50 nm or more, or about 75 nm or more). Alternatively, or in addition, the abrasive can have an average particle size of about 250 nm or less (e.g., about 200 nm or less, or about 150 nm or less, or about 125 nm or less, or about 100 nm or less). Thus, the abrasive can have an average particle size bounded by any two of the above endpoints. For example, the abrasive can have an average particle size of about 15 nm to about 250 nm, about 20 nm to about 200 nm, about 30 nm to about 200 nm, about 30 nm to about 150 nm, about 40 nm to about 250 nm, about 40 nm to about 200 nm, about 40 nm to about 150 nm, about 50 nm to about 250 nm, about 50 nm to about 200 nm, or about 50 nm to about 150 nm. In this regard, particle size refers to the diameter of the smallest sphere that encompasses the particle.

In an embodiment, the abrasive particles are treated with a copolymer comprising at least one sulfonate monomer and at least one monomer selected from the group consisting of carboxylate monomers, phosphonate monomers, and phosphate monomers. In a preferred embodiment, the copolymer comprises a combination of at least one sulfonate monomer and at least one carboxylate monomer. Preferably, the sulfonate monomer is selected from the group consisting of vinyl sulfonic acid, 2-(methacryloyloxy)ethanesulfonic acid, styrene sulfonic acid, 2-acrylamido-2-methylpropane sulfonic acid. Preferably, the other monomer is selected from the group consisting of acrylic acid, methacrylic acid, itaconic acid, maleic acid, maleic anhydride, vinylphosphonic acid, 2-(methacroyloxy)ethylphosphate, and combinations thereof. More preferably, the other monomer comprises at least one carboxylate monomer and most preferably comprises at least one acrylate monomer. In particular embodiments the copolymer is selected from the group consisting of polyacrylic acid-co-polyacrylamido-2-methylpropane sulfonic acid, polyacrylic acid-co-polystyrenesulfonic acid, and polyvinylphosphonic acid-co-polyarylamido-2-methylpropane sulfonic acid.

In another embodiment, the abrasive particles are treated with a negatively-charged polymer or copolymer. The negatively-charged polymer or copolymer can be any suitable polymer or copolymer. The negatively-charged polymer or copolymer preferably comprises at least one sulfonate monomer which is different than the copolymer comprising at least one sulfonate monomer and at least one monomer selected from the group consisting of carboxylate monomers, phosphonate monomers, and phosphate monomers. Preferably, the negatively-charged polymer or copolymer comprises repeating units selected from the group consisting of vinyl sulfonic acid, 2-(methacryloyloxy)ethanesulfonic acid, styrene sulfonic acid, 2-acrylamido-2-methylpropane sulfonic acid, and combinations thereof. Most preferably, the negatively-charged polymer or copolymer is selected from the group consisting of poly(2-acrylamido-2-methylpropane sulfonic acid) and polystyrenesulfonic acid.

The abrasive particles can be separately treated with a polymer or copolymer prior to addition to the polishing composition. Any suitable method can be used to treat the abrasive particles with the polymer or copolymer. For example, the abrasive particles can be treated with the polymer or copolymer under high shear conditions using, for example, a Waring blender. In other embodiments, the abrasive particles can be treated with the polymer or copolymer in situ during preparation of the polishing composition. The polymer or copolymer can be added at any time during the preparation of the polishing composition, either before the addition of the abrasive particles, simultaneously with the abrasive particles, or after addition of the abrasive particles, with one or more of the other components of the polishing composition added or present at any suitable time.

Desirably, the abrasive comprises, consists essentially of, or consists of abrasive particles that have a negative zeta potential at the pH of the polishing composition. In some embodiments, the abrasive particles, when untreated, can have a positive zeta potential at the pH of the polishing composition, but have a negative zeta potential at the pH of the polishing composition upon treatment with a polymer or copolymer as described herein. In other embodiments, the abrasive can be an untreated abrasive having a negative zeta potential at the pH of the polishing composition. Non-limiting examples of abrasives comprising particles having a negative zeta potential at the pH of the polishing composition include wet-process silica and fumed silica. The zeta potential of a particle refers to the difference between the electrical charge of the ions surrounding the particle and the electrical charge of the bulk solution (e.g., the liquid carrier and any other components dissolved therein).

The polishing composition comprises a complexing agent for aluminum. The complexing agent for aluminum can be any suitable complexing agent. Preferably, the complexing agent for aluminum is an organic carboxylic acid. More preferably, the complexing agent for aluminum is selected from the group consisting of malonic acid, phthalic acid, lactic acid, tartaric acid, gluconic acid, citric acid, malic acid, glycolic acid, maleic acid, and combinations thereof.

The polishing composition can comprise any suitable amount of the complexing agent for aluminum. The polishing composition can contain about 0.1 wt. % or more, e.g., about 0.2 wt. % or more, about 0.3 wt. % or more, about 0.4 wt. % or more, or about 0.5 wt. % or more of the complexing agent for aluminum. Alternatively, or in addition, the polishing composition can contain about 3 wt. % or less, e.g., about 2.5 wt. % or less, about 2 wt. % or less, about 1.5 wt. % or less, or about 1 wt. % or less of the complexing agent for aluminum. Thus, the polishing composition can comprise the complexing agent for aluminum in an amount bounded by any two of the above endpoints recited for the abrasive particles. For example the polishing composition can comprise about 0.1 wt. % to about 3 wt. %, about 0.1 wt. % to about 2.5 wt. %, about 0.1 wt. % to about 2 wt. %, about 0.3 wt. % to about 3 wt. %, about 0.3 wt. % to about 2.5 wt. %, about 0.3 wt. % to about 2 wt. %, about 0.5 wt. % to about 3 wt. %, about 0.5 wt. % to about 2.5 wt. %, or about 0.5 wt. % to about 2 wt. % of the complexing agent for aluminum.

The abrasive desirably is suspended in the polishing composition, more specifically in the water of the polishing composition. When the abrasive is suspended in the polishing composition, the abrasive preferably is colloidally stable. The term colloid refers to the suspension of abrasive particles in the water. Colloidal stability refers to the maintenance of that suspension over time. In the context of this invention, an abrasive is considered colloidally stable if, when a suspension of the abrasive in water or in the polishing composition is placed into a 100 ml graduated cylinder and allowed to stand unagitated for a time of 2 hours (e.g., for a time of 4 hours, or for a time of 8 hours, or for a time of 24 hours, or for a time of one week, or for a time of 4 weeks, or for a time of 16 weeks), the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., $\{[B]-[T]\}/[C] \leq 0.5$). The value of $[B]-[T]/[C]$ desirably is less than or equal to 0.3, and preferably is less than or equal to 0.1.

The polishing composition optionally further comprises an agent that oxidizes aluminum. The agent that oxidizes aluminum can be any agent having a suitable oxidation potential at the pH of the polishing composition. Non-limiting examples of suitable oxidizing agents include oxidizing agents selected from the group consisting of hydrogen peroxide, organic peroxy acids, persulfate, nitrate, periodate, perbromate, bromate, ferric salts, and combinations thereof.

The polishing composition can comprise any suitable amount of the agent that oxidizes aluminum. The polishing composition can contain about 0.1 wt. % or more, e.g., about 0.25 wt. % or more, about 0.5 wt. % or more, about 0.75 wt. % or more, or about 1 wt. % or more of the agent that oxidizes aluminum. Alternatively, or in addition, the polishing composition can contain about 5 wt. % or less, e.g., about 4 wt. % or less, about 3 wt. % or less, about 2 wt. % or less, or about 1 wt. % or less of the agent that oxidizes aluminum. Thus, the polishing composition can comprise the agent that oxidizes aluminum in an amount bounded by any two of the above endpoints recited for the abrasive particles. For example the polishing composition can comprise about 0.1 wt. % to about 5 wt. %, about 0.25 wt. % to about 4 wt. %, about 0.5 wt. % to about 3 wt. %, about 0.75 wt. % to about 2 wt. %, about 1 wt. % to about 3 wt. %, or about 1 wt. % to about 2 wt. % of the agent that oxidizes aluminum.

The polishing composition optionally further comprises a surfactant. The surfactant can be an anionic, non-ionic, or a zwitterionic surfactant. Advantageously, the presence of the surfactant in the polishing composition improves the colloidal stability of the polishing composition, stabilizes the particle size of abrasive particles, and/or improves the topography of semiconductor wafers that are polished with the polishing composition. Non-limiting examples of suitable surfactants include polysulfonates, polycarboxylates, polyphosphonates, polyalcohols (e.g., polyvinyl alcohols), copolymers comprising monomers selected from the group consisting of sulfonates, carboxylates, phosphonates, alcohols, and combinations thereof.

In a preferred embodiment, the surfactant is an alkyldiphenyloxide sulfonate surfactant. Typically, the alkyldiphenyloxide sulfonate surfactant has the structure:

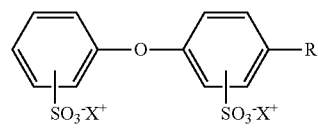

wherein R is a $C_1$-$C_{30}$, preferably $C_6$-$C_{30}$, more preferably $C_6$-$C_{22}$ linear or branched, saturated or unsaturated alkyl group, wherein the alkyl group optionally contains one or more heteroatoms selected from the group consisting of O and N, and wherein $X^+$ is H or a cation, e.g., an alkali metal cation or alkaline earth cation (e.g., sodium, potassium, lithium, calcium, magnesium, and the like). Examples of suitable alkyldiphenyloxide sulfonate surfactants include surfactants commercially available from the Dow Chemical Company (Midland, Mich.) under the trade names Dowfax™ 2A1, Dowfax™ 3B2, Dowfax™ 8390, Dowfax™ C6L, Dowfax™ C10L, and Dowfax™ 30599.

The polishing composition can contain any suitable amount of the surfactant. Thus, the polishing composition can contain 0.001 wt. % or more, e.g., about 0.005 wt. % or more, about 0.01 wt. % or more, about 0.05 wt. % or more, about 0.1 wt. % or more, about 0.2 wt. % or more, about 0.3 wt. % or more, about 0.4 wt. % or more, or about 0.5 wt. % or more of the surfactant. Alternatively, or in addition, the polishing composition can contain about 2 wt. % or less, e.g., about 1.8 wt. % or less, about 1.6 wt. % or less, about 1.4 wt. % or less, about 1.2 wt. % or less, or about 1 wt. % or less of the surfactant. Thus, the polishing composition can comprise the surfactant in an amount bounded by any two of the above endpoints recited for the surfactant. For example the polishing composition can comprise about 0.001 wt. % to about 2 wt. %, about 0.05 wt. % to about 1.8 wt. %, about 0.1 wt. % to about 1.6 wt. %, about 0.2 wt. % to about 1.4 wt. %, about 0.3 wt. % to about 1.2 wt. %, about 0.4 wt. % to about 1.2 wt. %, or about 0.5 wt. % to about 1 wt. % of the surfactant.

Desirably, the polishing composition does not comprise a compound of the formula: $(X^2)_n$-L wherein $X^2$ represents tetrazole, 1,2,4-triazole, 1,2,3-triazole, or benzotriazole, wherein L represents a linking group, for example, wherein L represents a linking group having a valence of 2 or more which contains at least one group selected from the group consisting of ureido groups, thioureido groups, amide groups, ester groups, sulfonamide groups, sulfonureido groups, hydroxy groups, carbamate groups, ether groups, amino groups, carboxy groups, sulfo groups, and heterocyclic groups, and n is an integer of 2 or more.

Desirably, the polishing composition will have a pH of about 1 or more (e.g., about 2 or more). Preferably, the polishing composition will have a pH of about 5 or less (e.g., about 4 or less, or about 3 or less). More preferably, the polishing composition will have a pH of about 2 to about 4 (e.g., about 2 to about 3).

The pH of the polishing composition can be achieved and/or maintained by any suitable means. More specifically, the polishing composition can further comprise a pH adjustor, a pH buffering agent, or a combination thereof. The pH adjustor can be any suitable pH-adjusting compound. For example, the pH adjustor can be nitric acid, potassium hydroxide, ammonium hydroxide, or combinations thereof. The pH buffering agent can be any suitable buffering agent, for example, phosphates, sulfates, acetates, borates, ammonium salts, and the like. The polishing composition can comprise any suitable amount of a pH adjustor and/or a pH buffering agent, provided that a suitable amount of the buffering agent is used to achieve and/or maintain the pH of the polishing composition within the ranges set forth herein.

The polishing composition optionally comprises a film-forming agent (i.e., a corrosion inhibitor). The film-forming agent can be any suitable film-forming agent for any component(s) of the substrate. Preferably, the film-forming agent is a copper-corrosion inhibitor or a tungsten-corrosion inhibitor. For the purposes of this invention, a film-forming agent is any compound, or mixture of compounds, that facilitates the formation of a passivation layer (i.e., a dissolution-inhibiting layer) on at least a portion of the surface being polished. Useful film-forming agents include, for example, nitrogen-containing heterocyclic compounds. The film-forming agent desirably comprises one or more 5- or 6-membered, heterocyclic, nitrogen-containing rings. Preferred film-forming agent include 1,2,3-triazole, 1,2,4-triazole, benzotriazole, benzimidazole, benzothiazole, and derivatives thereof, such as, for example, hydroxy-, amino-, imino-, carboxy-, mercapto-, nitro-, urea-, thiourea-, or alkyl-substituted derivatives thereof. Most preferably, the film-forming agent is selected from the group consisting of benzotriazole, 1,2,4-triazole, and mixtures thereof.

The polishing composition can contain any suitable amount of the film-forming agent. Thus, the polishing composition can contain 0.0001 wt. % or more, e.g., about 0.0005 wt. % or more, about 0.001 wt. % or more, about 0.005 wt. % or more, about 0.01 wt. % or more, or about 0.1 wt. % or more of the film-forming agent. Alternatively, or in addition, the polishing composition can contain about 2 wt. % or less, e.g., about 1.8 wt. % or less, about 1.6 wt. % or less, about 1.4 wt. % or less, about 1.2 wt. % or less, or about 1 wt. % or less of the film-forming agent. Thus, the polishing composition can comprise the film-forming agent in an amount bounded by any two of the above endpoints recited for the film-forming agent. For example the polishing composition can comprise about 0.0001 wt. % to about 2 wt. %, about 0.005 wt. % to about 1.8 wt. %, about 0.01 wt. % to about 1.6 wt. %, or about 0.1 wt. % to about 1 wt. % of the film-forming agent.

The polishing composition optionally further comprises a biocide. The biocide can be any suitable biocide, for example, an isothiazolinone biocide. The amount of biocide used in the polishing composition typically is about 1 ppm to about 500 ppm, and preferably is about 10 ppm to about 200 ppm.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., abrasive, complexing agent for aluminum, agent that oxidizes aluminum, surfactant, optional film-forming agent, optional biocide, etc.) as well as any combination of ingredients (e.g., abrasive, complexing agent for aluminum, agent that oxidizes aluminum, surfactant, optional film-forming agent, optional biocide, etc.).

For example, the abrasive can be dispersed in water. The complexing agent for aluminum, optional surfactant, optional film-forming agent, and optional biocide can then be added, and mixed by any method that is capable of incorporating the components into the polishing composition. The agent that oxidizes aluminum, if utilized, can be added at any time during the preparation of the polishing composition. The polishing composition can be prepared prior to use, with one or more components, such as the agent that oxidizes aluminum, added to the polishing composition just before use (e.g., within about 1 minute before use, or within about 1 hour before use, or within about 7 days before use). The polishing composition also can be prepared by mixing the components at the surface of the substrate during the polishing operation.

The polishing composition can be supplied as a one-package system comprising abrasive, complexing agent for aluminum, agent that oxidizes aluminum, surfactant, optional film-forming agent, optional biocide, and water. Alternatively, the abrasive can be supplied as a dispersion in water in a first container, and complexing agent for aluminum, surfactant, optional film-forming agent, and optional biocide can be supplied in a second container, either in dry form, or as a solution or dispersion in water. The agent that oxidizes aluminum desirably is supplied separately from the other components of the polishing composition and is combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). The components in the first or second container can be in dry form while the components in the other container can be in the form of an aqueous dispersion. Moreover, it is suitable for the components in the first and second containers to have different pH values, or alternatively to have substantially similar, or even equal, pH values. Other two-container, or three or more-container, combinations of the components of the polishing composition are within the knowledge of one of ordinary skill in the art.

The polishing composition of the invention also can be provided as a concentrate which is intended to be diluted with an appropriate amount of water prior to use. In such an embodiment, the polishing composition concentrate can comprise the abrasive, complexing agent for aluminum, surfactant, optional film-forming agent, optional biocide, and water, with or without the optional agent that oxidizes aluminum, in amounts such that, upon dilution of the concentrate with an appropriate amount of water, and the optional agent that oxidizes aluminum if not already present in an appropriate amount, each component of the polishing composition will be present in the polishing composition in an amount within the appropriate range recited above for each component. For example, the abrasive, complexing agent for aluminum, surfactant, optional film-forming agent, and optional biocide can each be present in the concentration in an amount that is about 2 times (e.g., about 3 times, about 4 times, or about 5 times) greater than the concentration recited above for each component so that, when the concentrate is diluted with an equal volume of (e.g., 2 equal volumes of water, 3 equal volumes of water, or 4 equal volumes of water, respectively), along with the optional agent that oxidizes aluminum in a suitable amount, each component will be present in the polishing composition in an amount within the ranges set forth above for each component. Furthermore, as will be understood by those of ordinary skill in the art, the concentrate can contain an appropriate fraction of the water present in the final polishing composition in order to ensure that other components are at least partially or fully dissolved in the concentrate.

EXAMPLES

The following examples further illustrate the invention but, of course, should not be construed as in any way limiting its scope.

In the following examples, the polishing experiments were conducted using a three-platen Mirra polisher (Applied Materials; Santa Clara, Calif.). The polishing parameters were as follows: Polishing was conducted on platen 1 in two phases: phase 1 at 24.2 kPa downforce, phase 2 at 13.8 kPa downforce using a D100 polishing pad (Cabot Microelectronics Corporation, Aurora, Ill.). Platen 2 was used for buff cleaning. The substrates consisted of titanium-lined patterned silicon dioxide-coated silicon wafers overcoated with aluminum. The substrates comprised a pattern comprising 10 μm lines separated by 10 μm spacings.

Example 1

This example demonstrates the improvement in defectivity achievable by the polishing compositions of the invention, when used to polish substrates comprising aluminum deposited on titanium-lined features on a dielectric layer.

Two substrates were separately polished with two different polishing compositions, Composition 1A and Composition 1B. Each of the polishing compositions contained 1.5 wt. % of lactic acid and 3 wt. % of hydrogen peroxide in water at a pH of 3.4. Composition 1A (comparative) further contained 0.5 wt. % of α-alumina treated with about 1150 ppm of polyacrylamino-2-methylpropane sulfonic acid. Composition 1B (invention) further contained 0.5 wt. % of α-alumina treated with about 1150 ppm of polyacrylic acid-co-polyacrylamido-2-methylpropane sulfonic acid. Composition 1C (comparative) further contained 0.5 wt. % of α-alumina treated with about 1150 ppm of polyacrylic acid. Composition 1C was not colloidally stable and therefore was not used in polishing substrates.

Following polishing, the substrates were cleaned, and the defectivity was inspected by an AIT wafer inspection system (KLA-Tencor; Milpitas, Calif.). Normalized total defects were determined as the ratio of scanned images to total number of images multiplied by the defect count. The results are set forth in Table 1.

TABLE 1

| Composition | Sulfonate Monomer (molar %) | Molecular Weight of Polymer or Copolymer | Normalized Total Defects |
|---|---|---|---|
| 1A (comparative) | 100 | 20000 | 100 |
| 1B (inventive) | 20 | 30000 | 21 |
| 1C (comparative) | 0 | 50000 | NA |

As is apparent from the results set forth in Table 1, the use of Composition 1B, which contained α-alumina treated with polyacrylic acid-co-polyacrylamido-2-methytpropane sulfonic acid, resulted in approximately 20% of the normalized total defects as observed with the use of Composition 1A, which contained α-alumina treated with polyacrylamino-2-methylpropane sulfonic acid. Composition 1B was colloidally stable for at least 6 months, while Composition 1A maintained colloidal stability for 7 to 60 days.

Example 2

This example demonstrates the improvement in defectivity achievable by the polishing compositions of the invention, when used to polish substrates comprising aluminum deposited on titanium-lined features on a dielectric layer.

Five substrates were separately polished with five different polishing compositions, Compositions 2A-2E. Each of the polishing compositions contained about 1 wt. % of lactic acid, about 3 wt. % of hydrogen peroxide, and 1000 ppm of Dowfax™ 8390 (an alkyldiphenyloxide sulfonate surfactant) in water at a pH of 3.4. Composition 2A (comparative) further contained 0.5 wt. % of α-alumina treated with about 1150 ppm of polyacrylamino-2-methylpropane sulfonic acid. Compositions 2B-2E (inventive) further contained 0.5 wt. % of α-alumina treated with about 1150 ppm of polyacrylic acid-co-polyacrylamido-2-methylpropane sulfonic acid copolymers having varying molar percentages of sulfonate-containing monomers and having varying molecular weights as set forth in Table 2.

Following polishing, the substrates were cleaned, and the defectivity was inspected by an AIT wafer inspection system. Total scratch defects were determined as the number of images with scratches as observed by the AIT system. The results are set forth in Table 2.

TABLE 2

| Composition | Sulfonate Monomer (molar %) | Molecular Weight | Total Scratch Defects |
|---|---|---|---|
| 2A (comparative) | 100 | 20000 | 2227 |
| 2B (inventive) | 25 | 30000 | 33 |
| 2C (inventive) | 20 | 21000 | 43 |
| 2D (inventive) | 17 | 24000 | 34 |
| 2E (inventive) | 14 | 7400 | 47 |

As is apparent from the results set forth in Table 2, the use of Compositions 2B-2E, all of which contained α-alumina treated with polyacrylic acid-co-polyacrylamido-2-methylpropane sulfonic acid copolymers, resulted in approximately 1.5% to approximately 2.1% of total scratch defects as compared with the use of Composition 2A, which contained α-alumina treated with polyacrylamino-2-methylpropane sulfonic acid.

Example 3

This example demonstrates the improvement in defectivity achievable by the polishing compositions of the invention, when used to polish substrates comprising aluminum deposited on titanium-lined features on a dielectric layer.

Three substrates were separately polished with three different polishing compositions, Compositions 3A-3C. Each of the polishing compositions contained about 1 wt. % of lactic acid and about 3 wt. % of hydrogen peroxide in water at a pH of 3.4. Composition 3A (comparative) further contained 0.5 wt. % of α-alumina treated with about 1150 ppm of polyacrylamino-2-methylpropane sulfonic acid and 1000 ppm of a polycarboxylic acid polymer having a molecular weight of 100,000. Composition 3B (invention) further contained 0.5 wt. % of α-alumina treated with about 1150 ppm of polyacrylamino-2-methylpropane sulfonic acid and 1000 ppm of Dowfax™ 8390 (an alkyldiphenyloxide sulfonate surfactant). Composition 3C (invention) further contained 0.5 wt. % of α-alumina treated with about 1150 ppm of polyacrylic-co-polyacrylamido-2-methylpropane sulfonic acid but did not further contain any additional polymer or copolymer. The treated α-alumina abrasives had a negative zeta potential in the polishing compositions.

Following polishing, the substrates were cleaned. The amount of aluminum dishing was measured, and the defectivity was inspected by an AIT wafer inspection system. Total scratch defects were determined as the number of images with scratches as observed by the AIT system. The results are set forth in Table 3.

TABLE 3

| Composition | Additive | Dishing (Å) | Total Scratch Defects |
|---|---|---|---|
| 3A (comparative) | Polycarboxylic acid | 61 | 19000 |
| 3B (inventive) | Dowfax™ 8390 | 42 | 1600 |
| 3C (inventive) | None | 209 | 475 |

As is apparent from the results set forth in Table 3, the use of Composition 3B, which contained 1000 ppm of an alkyldiphenyloxide sulfonate surfactant (i.e., Dowfax™ 8390), resulted in approximately 8.4% of total scratch defects as compared with the use of Composition 3A, which contained 1000 ppm of a polycarboxylic acid polymer. The use of Composition 3C, which contained α-alumina treated with about 1150 ppm of polyacrylic-co-polyacrylamido-2-methylpropane sulfonic acid but did not further contain any additional copolymer, resulted in approximately 2.5% and approximately 30% of total scratch defects as compared with use of Compositions 3A and 3B, respectively. However, the use of Composition 3C resulted in dishing which was approximately 5 times greater than observed with the use of Composition 3B.

Example 4

This example demonstrates the improvement in defectivity achievable by the polishing compositions of the invention, when used to polish substrates comprising aluminum deposited on titanium-lined features on a dielectric layer.

Three substrates were separately polished with three different polishing compositions, Compositions 4A-4C. Each of the polishing compositions contained about 0.5 wt. % of α-alumina treated with about 1150 ppm of polyacrylic-co-polyacrylamido-2-methylpropane sulfonic acid, about 1 wt. % of lactic acid, and about 3 wt. % of hydrogen peroxide in water at a pH of 3.4. Composition 4A (control) further contained 1000 ppm of a polycarboxylic acid polymer having a molecular weight of 100,000. Composition 4B (comparative) further contained 1000 ppm of Calsoft LAS99 (a $C_{12}$-$C_{16}$ linear alkylbenzenesulfonate). Composition 4C (invention) further contained 1000 ppm of Dowfax™ 8390 (an alkyldiphenyloxide sulfonate surfactant).

Following polishing, the substrates were cleaned. The amount of aluminum dishing was measured, and the defectivity was inspected by an AIT wafer inspection system. Total scratch defects were determined as the number of images with scratches as observed by the AIT system. The results are set forth in Table 4.

TABLE 4

| Composition | Additive | Al Removal Rate (Å/min) | Dishing (Å) | Total Scratch Defects |
|---|---|---|---|---|
| 4A (control) | Polycarboxylic acid | 1900 | 44 | 2500 |
| 4B (comparative) | Calsoft LAS99 | 1900 | 67 | 2500 |
| 4C (invention) | Dowfax™ 8390 | 2300 | 66 | 32 |

As is apparent from the results set forth in Table 4, inventive Composition 4C, which contained an alkyldiphenyloxide disulfonate surfactant (Dowfax™ 8390) as the additive, exhibited approximately 1.3% of total scratch defects as compared with control Composition 4A, which contained a polycarboxylic acid as the additive, and Composition 4B, which contained a $C_{12}$-$C_{16}$ linear alkylbenzenesulfonate (Calsoft LAS99) as the additive.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of chemically-mechanically polishing a substrate, which method comprises:
   (i) providing a substrate comprising at least one layer of aluminum,
   (ii) providing a polishing pad,
   (iii) providing a polishing composition comprising:
      (a) an abrasive consisting of α-alumina particles, wherein the α-alumina particles are coated with a copolymer comprising at least one sulfonate monomer and at least one monomer selected from the group consisting of carboxylate monomers, phosphonate monomers, and phosphate monomers,
      (b) a complexing agent for aluminum, and
      (c) water,
   (iv) contacting a surface of the substrate with the polishing pad and the polishing composition, and
   (v) abrading at least a portion of the surface of the substrate to remove at least some aluminum from the surface of the substrate and to polish the surface of the substrate, wherein the polishing composition has a pH of about 1 to about 6, and wherein the abrasive is colloidally stable in the polishing composition.

2. The method of claim 1, wherein the copolymer comprises a combination of at least one sulfonate monomer and at least one carboxylate monomer.

3. The method of claim 2, wherein at least one carboxylate monomer comprises at least one acrylate monomer.

4. The method of claim 1, wherein the complexing agent for aluminum comprises an organic carboxylic acid.

5. The method of claim 4, wherein the organic carboxylic acid is selected from the group consisting of malonic acid, phthalic acid, lactic acid, tartaric acid, gluconic acid, citric acid, malic acid, glycolic acid, maleic acid, and combinations thereof.

6. The method of claim 1, wherein the polishing composition further comprises an agent that oxidizes aluminum.

7. The method of claim 6, wherein the agent that oxidizes aluminum is selected from the group consisting of hydrogen peroxide, organic peroxy acids, persulfate, nitrate, periodate, perbromate, bromate, ferric salts, and combinations thereof.

8. The method of claim 1, wherein the polishing composition further comprises a surfactant.

9. The method of claim 8, wherein the surfactant is an alkyldiphenyloxide disulfonate surfactant.

10. The method of claim 1, wherein the substrate further comprises at least one layer selected from the group consisting of tungsten, titanium, titanium nitride, tantalum, and tantalum nitride.

11. A method of chemically-mechanically polishing a substrate, which method comprises:
 (i) providing a substrate comprising at least one layer of aluminum,
 (ii) providing a polishing pad,
 (iii) providing a polishing composition comprising:
  (a) an abrasive, wherein the abrasive comprises particles having a negative zeta potential in the polishing composition,
  (b) a complexing agent for aluminum,
  (c) at least one alkyldiphenyloxide disulfonate surfactant, and
  (d) water,
 (iv) contacting a surface of the substrate with the polishing pad and the polishing composition, and
 (v) abrading at least a portion of the surface of the substrate to remove at least some aluminum from the surface of the substrate and to polish the surface of the substrate,
wherein the polishing composition has a pH of about 1 to about 6, and wherein the abrasive is colloidally stable in the polishing composition.

12. The method of claim 11, wherein the abrasive is selected from the group consisting of wet process silica, fumed silica, and surface-coated α-alumina.

13. The method of claim 11, wherein the complexing agent for aluminum comprises an organic carboxylic acid.

14. The method of claim 13, wherein the organic carboxylic acid is selected from the group consisting of malonic acid, phthalic acid, lactic acid, tartaric acid, gluconic acid, citric acid, malic acid, glycolic acid, maleic acid, and combinations thereof.

15. The method of claim 11, wherein the polishing composition further comprises an agent that oxidizes aluminum.

16. The method of claim 15, wherein the agent that oxidizes aluminum is selected from the group consisting of hydrogen peroxide, organic peroxy acids, persulfate, nitrate, periodate, perbromate, bromate, ferric salts, and combinations thereof.

* * * * *